United States Patent
Barnhart

(12) 
(10) Patent No.: US 6,795,944 B2
(45) Date of Patent: Sep. 21, 2004

(54) TESTING REGULARLY STRUCTURED LOGIC CIRCUITS IN INTEGRATED CIRCUIT DEVICES

(75) Inventor: Carl F. Barnhart, Tucson, AZ (US)

(73) Assignee: International Business Machines Corporation, Armonk, NY (US)

(*) Notice: Subject to any disclaimer, the term of this patent is extended or adjusted under 35 U.S.C. 154(b) by 624 days.

(21) Appl. No.: 09/853,106

(22) Filed: May 10, 2001

(65) Prior Publication Data

US 2002/0170009 A1 Nov. 14, 2002

(51) Int. Cl.$^7$ ................. G01R 31/3177; G01R 31/3183

(52) U.S. Cl. ...................................... 714/726; 714/736

(58) Field of Search ................................. 714/726, 736

(56) References Cited

FOREIGN PATENT DOCUMENTS

EP          206468 A1 * 12/1986 ........... G01R/31/28

* cited by examiner

Primary Examiner—R. Stephen Dildine
(74) Attorney, Agent, or Firm—H. Daniel Schnurmann

(57) ABSTRACT

The test generation software takes advantage of the regularity of the structure without introducing significant changes to the test pattern generation software or to the manufacturing test tools. In this manner, the number of test patterns, the pattern data volume, and the length of the scan chains used for testing the imbedded repetitive structures is substantially reduced. The imbedded repetitive structures are tested by structuring and connecting the scan chain segments of the repeated structures in a way that permits identical test stimuli to be loaded into each copy of the repeated structure. A multiple input signature register or other such equivalent data compressing means provide the necessary data compression for reducing the volume of the test results that can be observed during scan by the tester to detect the presence of any fault that was observed.

14 Claims, 6 Drawing Sheets

TESTING REGULARLY STRUCTURED LOGIC CIRCUITS IN INTEGRATED CIRCUIT DEVICES

FIELD OF THE INVENTION

This invention is generally related to testing integrated circuits and, more particularly, to a method for testing imbedded repetitive structures, such as register arrays, wherein a test pattern generation algorithm takes advantage of the regularity of the structure without significantly modifying the test pattern generation software or the manufacturing test tools.

BACKGROUND OF THE INVENTION

With the increasing density and size of Application Specific Integrated Circuits (ASICs) there has been an increasing tendency toward repetitive instantiation of logic structures. In some cases, these are referred to bit-slices, wherein a multi-bit data structure is built from several copies of a single bit data structure. Other cases include instantiation of multiple input and output macros, multiple processor cores, or two-dimensional arrays of switching elements to form, e.g., a cross-point switch.

Current test structures, methodologies, and Automated Test Pattern Generation (ATPG) software do not take advantage of structural regularity, resulting in larger test data volumes and longer test times. Essentially, the logic in an ASIC is treated as flat, random logic. A typical example of a regular structure consists of Register Arrays (RA). As the name suggests, they are highly regular structures having the array and read multiplexing treated as independent but identical bit-slices. Since ASICs typically have a large number of register arrays, often with more storage elements in the arrays than that found in conventional (random) logic, and since such arrays are inherently more difficult to test due to the addressing requirements, the problem of testing such ASICs has become unmanageable.

Today's ASICs typically include one or more of five basic types of storage. These are: single bit registers, latches and Shift Register Latches (SRLs) used in random logic; Register Arrays (RAs) consisting of an array of registers or latches with appropriate addressing and clocking logic; Static Random Access Memory (SRAM) arrays, Dynamic Random Access Memory (DRAM) arrays; and, finally, Read Only Memories (ROM). The latter three are specialized circuits and are tested by specific deterministic patterns applied either by a tester or by so-called Built-In-Self-Test (BIST) logic built within the chip. The first two are commonly tested by test patterns generated uniquely for each such ASIC by ATPG software. For a "full scan" ASIC, all the storage elements of the first two types are modified to support both the normal function and a special test scan mode. These scannable storage elements are then connected together to form scan chains accessible by the tester.

In addition to storage arrays, it has become increasingly common to find functional blocks in the chip replicated several times. As a result, many chips have significant portions of their logic organized as repeated structures. Current ATPG techniques are unable to take advantage of this repetition, leading to an excessive test data volume and test application times.

While individual storage elements of the RA are scannable and, therefore, controllable and observable for test purposes, they are surrounded by address decoding logic that makes the application of test patterns tedious. In order to sensitize a fault within the array, many of the bits of address and control information must be set to specific values. Due to the mutually exclusive decoding of addresses, it prevents the test generator from simultaneously testing any other faults in the array unless they happen to fall within the same, already addressed, word. Even then, unless all the control conditions for the two candidate faults are identical it is still impossible to test both faults with a single pattern.

Current ATPG software randomly selects a single fault from a list of untested faults throughout the entire chip and generates a test pattern to test that fault. The test pattern is then fault simulated, and any faults detected (presumably including the target fault) are identified as tested. This is repeated until no additional testable faults remain. The regularity of any repeated structure in the ASIC, such as the bit slices of register arrays, is completely ignored. By taking advantage of the repetitive structures, a test pattern generated for a fault in a single instance of the repeated structures could be used to detect the same fault in all other instances. To achieve this, all storage elements in each instance of the repetitive structure must be loaded with the same test stimuli.

The number of patterns required to test the RAs has become a significant problem as the number of scannable elements (SRLs) in the RAs within a typical ASIC significantly exceeds the number of SRLs in the rest of the logic. This has led to long scan chains, increasing the test application time and high test pattern count, all of which increases the test data volume. The test time and volumes of the largest ASICs being built often overwhelm current testers.

FIG. 1A shows a typical Register Array (RA) (1) to be tested by conventional methodology. Logically, the RA is a two dimensional array of scannable latches to which selecting means (2) are added on the base of a multi-bit signal called Write Address, wherein a subset of the latches modifies their content by way of multi-bit data stored in an external Write Data Register (6). Further, there is also provided a second selecting means (3) based on a multi-bit signal called Read Address, wherein a subset of these latches are used for observing multi-bit signals called Read Data. The two dimensional array is logically organized along one dimension into single dimension arrays called Word (4), each having the same length, and along the second dimension into single dimension arrays called Bit Slice (5), again each of the same length. Word (4) is a subset of the array selected by the Write and Read Address decoding logic (2 and 3), wherein the latches in the word are ordered. A bit slice (5) includes a single latch or bit from each word (4), the latch having the same ordinal position within each of the words.

For testing purposes, all the latches in the array are scannable and are organized into one or more scan chain segments. An additional scan chain segment may exist for the Write Data Register (6). One or more scan chains (one is shown herein) are connected to the start of some scan chain segments (7). Further, one or more the segments may be connected serially (9) before the scan chains are routed to other scannable elements within the design (8).

To generate test patterns, a fault is selected somewhere within the chip. A plurality of stimulus bits, referred to as a test cube, are generated to test the fault and observe the results. Test cubes are merged as long as there is no conflict between the bits required for each test cube. Once a sufficient number of cubes is merged, the remaining bits of the scan data to be scanned into the scan chains are filled, usually with random data, to create a test pattern. The test pattern is then simulated to determine what faults have been detected, and those faults are removed from the list of untested faults.

Still referring to FIG. 1A, to test a fault in one of the Register Array storage elements (10) which can be identified as existing at the intersection of word (4) and bit slice (5), specific values for the Write Address register, Read Address register, and storage element (10) to be tested, a bit in the Write Data (6) and Read Data registers must be specified as part of the test cube, and those values scanned into the correct positions in the overall scan chains.

Although the array is a regularly repeated structure, even in the case when the scan chain segments within the array are designed to conform to a bit-slice (as shown), the serial connections of the scan chain segments take no advantage of these facts. Every bit of the scan chain is totally independent of every other bit. Yet, the corresponding fault of a different latch of the same word (4) requires that the same Read Address and Write Address values, and the same data be scanned into the additional latch in the word, and, possibly, into another bit of the Write Data (6) and Read Data Registers. Clearly, these two patterns can be merged since most of the data are identical. In fact, if the data to be scanned into a latch in Register Array (10) is scanned into all the latches of the targeted word (4), and if the same write data is scanned into all the bits of the Write Data Register (6), then the same fault will be tested at every latch of the selected word, not just one, with little more information than the original test cube. The odds of its happening in normal test generation is low, partly because the test generator is specifically designed for unstructured logic, and as such, attempts to select faults that are scattered around the chip rather than in logical proximity in order to improve merging of test cubes. Thus, in traditional scan testing of a Register Array, the organization of scan chain segments in the Register Array is unimportant, and the regularity of the array is ignored.

Attempts have been made in the past to resolve these problems in two ways: 1) by overriding the write address decoding so that more than one word at a time is selected, increasing the odds of testing more than one fault in an RA with a single pattern, and 2) by modifying the ATPG software to recognize equivalency groups of faults in each word that the ATPG targets, and to target all faults in an equivalence group jointly rather than singularly. This last approach has not gained wide acceptance since, in many cases, it provides little reduction in test data volume (duplicate stimulus data must be fed over several scan streams) and no improvement in test with pseudo-random patterns as in Logic BIST.

Current ATPG programs are unable to take into consideration multiple, repeated, structures because of the inherent assumption built into all ATPG programs, and all Design For Test rules, that data in different memory elements of the scan chains should be independent of all each other. That is, the data should be uncorrelated. When testing random logic, i.e., wherein an arbitrary subset of the storage elements in the scan chains feed an arbitrary Boolean expression, this independence is required to avoid non-testable faults. Indeed, within a single repeated structure, this requirement for independence of the stimulus data still holds. However, when a structure is repeated multiple times, and each copy of the structure is independent of other copies, then, identical (fully correlated) stimulus data may be scanned into each copy of the structure without creating non-testable faults.

OBJECTS OF THE INVENTION

Accordingly, it is an object of the present invention to test imbedded repetitive structures in integrated circuit chips and modules.

It is a further object to test the imbedded repetitive structures by having the test generation software take advantage of the regularity of the structure without introducing significant changes to the test pattern generation software or to the manufacturing test tools.

It is yet another object to substantially reduce the number of patterns, the pattern data volume, and the length of the scan chains used for testing the imbedded repetitive structures.

It is a more particular object to test the imbedded repetitive structures by structuring and connecting the scan chain segments of the repeated structures in a way that forces identical test stimuli to be loaded into each copy of the repeated structure.

It is a further object to provide means for compressing the test results that can be observed during scan by the tester to show any fault that was observed.

SUMMARY OF THE INVENTION

In a first aspect of the invention, there is provided a digital logic chip or module under test consisting of multiple instantiations of identical and separately identifiable structures built of some mix of combinational logic and sequential elements, the sequential elements being commonly referred to as registers, latches, flip-flops, or shift register latches. For test purposes, the sequential elements in the multiple instantiated structures are loaded with test stimuli using known scan test techniques.

The invention defines at least one test mode wherein: a) sequential elements in each the repeated structures are organized for test into one or more scan chain segments such that the scan chain segments in each repeated structure are identical to corresponding segments in all other repeated structures, (i.e., the test connections within the repeated structures are identical in addition to the identical functional connections); b) each set of identical scan chain segments are clocked with identical or equivalent scan clocks such that all segments perform the same number of shifts at the same point in the test scan sequence; c) each of the identical scan chain segments are presented with scan data such that the same logic value is loaded into the first element of every such scan chain segment in each cycle of the test scan sequence, wherein: i) for any identical segments, a single scan data stream fans-out and is connected to the scan input of the first element of every such segment, the scan data stream being provided directly from a scan-in pin, from the output of a selected scan chain segment, or from a single output of a different set of such segments, and ii) where one of the scan chain segments follows another scan chain of segments, the individual outputs of the first segment are connected to one or more of the individual inputs of the second set; and finally d) every output of each scan chain segment is connected to the input of a subsequent scan chain segment or to a test observation point. The connection may be direct, or may involve a linear combination of the outputs of two or more non-identical scan chain segments. The test observation point may be a chip scan-out pin, or one of parallel inputs of a Multiple-Input Signature Register (MISR), wherein the overflow bit of the signature register is connected to a chip scan-out pin. Moreover, each replication of the repeated structure receives the same stimulus scan data. This is achieved by connecting the corresponding scan inputs of the repeated structure to the single scan data stream. Although, this change represents a significant departure from the Design For Test architecture of the chip, it has the distinct advantage of not requiring changes in the ATPG software.

In addition to organizing the scan chain segments and the fan-out of a single scan data stream to all identical parallel scan chain segments into multiple repeated structures, the invention further provides means for controlling the state of the storage elements requiring less test data in an amount approximately equal to the repetition count of the repeated structure. This forces testing corresponding faults in each copy of the repeated structure with a single test pattern, reducing the number of test patterns by a factor approximately equal to the repetition count of the replicated structure.

BRIEF DESCRIPTION OF THE DRAWINGS

These and other objects, aspects and advantages of the invention will become more apparent from the following description and appended claims when taken in conjunction with the drawings, wherein:

DETAILED DESCRIPTION OF THE INVENTION

Figure 1A:
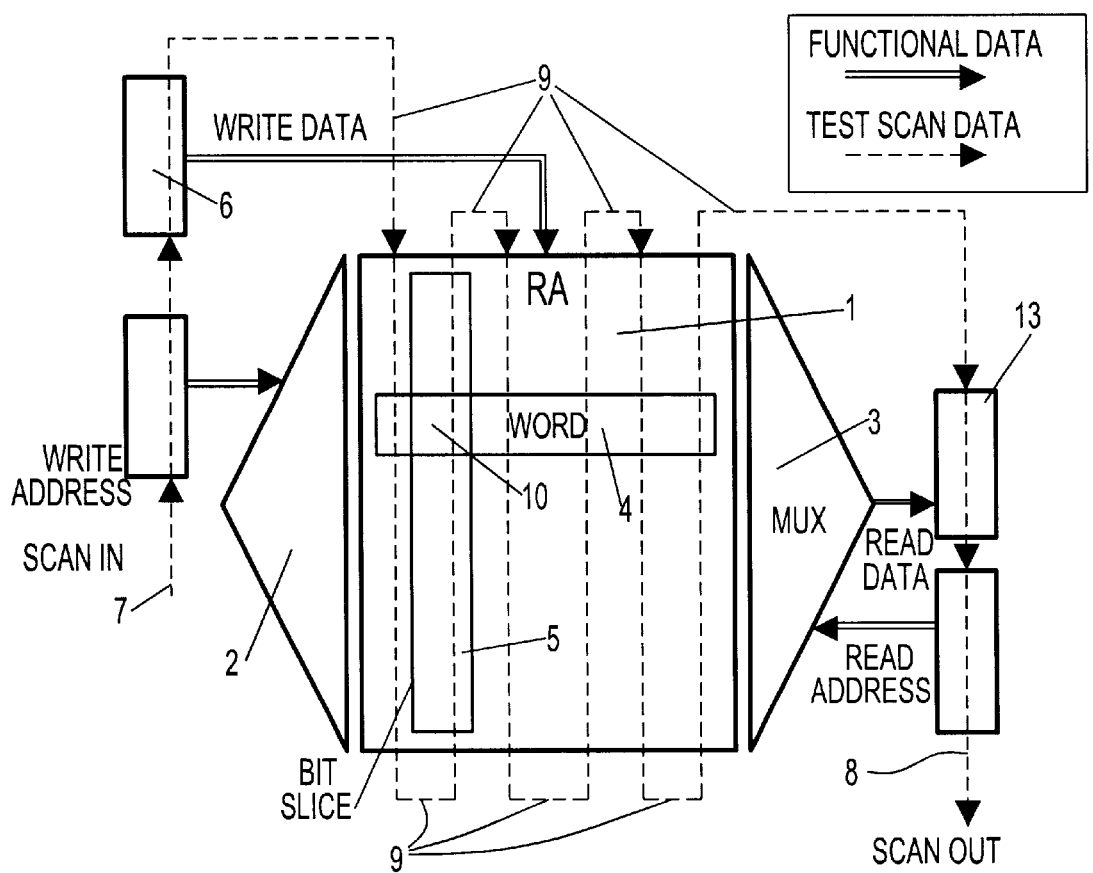
FIG. 1A illustrates a conventional regular structure, in this case a Register Array (RA), to be tested using a conventional scan test.

The present invention will now be explained in detail with reference to FIGS. 2 through 5.

The Basic Test Structure

The first requirement stated above is that all the bits of each word in the RA, or all the corresponding bits in each bit slice or each repeated functional block, should contain the same data prior to the application of a test. This can be accomplished most easily if the scan chain segments are organized identically for all the bit slices or repeated functional blocks in terms of the order of storage elements within each scan chain segment.

Although the test scan chain segments through the bit slices or other repeated functional blocks are depicted to be identical, it is not uncommon for such blocks to be instantiated on a chip with the scan ports of the storage elements left unconnected. Once the chip is fully connected functionally, a designer or a design automation program is used to interconnect the scan chains. In accordance with the assumption that all scan bits are independent, this process typically ignores any logical repetition and connects the scan chains using some other criteria. In the present invention, scan chain segments through the bit slices or other repeated functional blocks must be identical Referring now to FIG. 2 that illustrates the RA (1) tested in accordance with the invention, it is necessary that all the elements within the repeated structure be first defined. In addition to the bit slice of storage array (5), the repeated structure includes one bit of the Write Data Register (6), and a bit slice of the Read Data select logic (3). Specifically, the scan chain segments of the array must be organized such that a single bit (e.g., 10) of each word (4) of array (1) is contained in a single scan chain segment and the order of words within each such scan chain segment be the same. Each bit-slice (5) therefore contains a single scan chain segment, and as is often the case in current practice, each scan chain segment through an RA contains only one bit slice of the register array. It is common practice for data to be written into the array be held in register (6) that is of the same size as array word (4). The bits of this register should be distributed across the multiple scan chain segments in the same way as the bits of the array words.

Referring now to the RA read circuitry (3), an analysis reveals that the read selection logic is also part of the repeated structure, i.e., there exists an identical structure for selecting each read output bit (each bit of Read Data) which takes as data inputs only those storage bits that are connected into a single bit slice (5) scan chain segment. Each such structure is independent of all identical structures for the other bits. To maintain independence, it is assumed that the read data is observed in other scan chains (13) or at chip primary outputs.

To complete the analysis of the RA example, the write circuitry will now be further described. The write address decoding (2) normally selects a single word (4) for writing and deselects the other words. Although the Write address decoding is not part of the repeated structures, the decoding results are observable at the RA storage elements, i.e., in the bit-slice (5) scan chain segments. If a write address decode override technique is used during test, then multiple words (up to and including all the words) may be selected in a single test. This further reduces the number of test patterns that would need to be applied to test the array, but makes testing the write address logic itself more difficult.

It is assumed that the write clocking (not shown) of all the bits of a single word (4) are logically identical, which is a common practice. In the present example, a single stream of scan data (7) from, ultimately, a single scan pin accessed by the tester, fans-out to the beginning of every bit-slice scan chain of RA (1). This ensures that all the bits of each word in array (1) and all the bits of the word (6) to be written to the array have the same data. Data in different words (4) need not be the same, but each word must be either all '0's or all '1's. Thus, all the bits (10) of a word (4) are conditioned identically (current state, data and clock inputs), such that the same fault will be tested in each repeated structure with the application of a single test.

It may be recalled that a primary aspect of the invention resides in architecturing the scan chains and the fan-out of a single scan data stream to all of the identical scan chains of multiply instantiated blocks, such as the parallel bit-slices of the RA. It provides a way of fully controlling the state of the storage elements within the repeated structures with significantly less test data than previously by a factor roughly equal to the bit-width of the array or the repetition factor of the functional blocks, due to the fan-out of the scan data streams. Since the data in each repeated structure is now identical, this forces the simultaneous testing of corresponding faults in each repeated structure with a single test pattern, reducing the number of patterns that need be applied also by a factor roughly equal to the bit-width of the array or the repetition factor of the functional blocks.

Standard algorithms used by the ATPG software require no major changes when using this structure. A pattern generated for any single fault in a repeated structure, upon fault simulation, results in the fault being detected in all the bit positions in all of the repeated structures.

When a single scan data stream fans-out to multiple scan chain segments that are not identical and which may drive common logic, it significantly reduces the effectiveness of the test pattern, because all storage elements at the same ordinal position within the scan chain receive the same data. Such data is referred to as correlated, and it will prevent many faults from being tested at all.

In the current context of repeated structures, the data is correlated but is applied to physically different but identical, independent, structures. This actually improves the test coverage since the repeated faults are detected by a pattern that targeted only one of them, and eliminates the need for additional patterns targeting the rest of the repeated faults. The correlation may still create test problems in the current proposal if outputs from several of the repeated structures propagate through common combinational logic prior to being observed at another scannable storage element or chip output. There exists several ways for dealing with this problem well known to practitioners in the art. A common approach avoids the problem altogether by placing observation storage elements in series with selected outputs of the repeated structures. Another approach provides an alternate test mode with all of the scan chain segments connected conventionally in series, and without fanning-out the scan data streams. This allows testing any faults that cannot be tested with parallel scan segments,. A conservative design practice requires that such a conventional scan structure be used as a backup.

So far, all the structures discussed provide significant improvements in the application of test stimuli. To achieve the goal of reducing the test data volume and test application time, the collection of responses must also be considered.

It is typical for ATPG programs to assume that for every scan in pin there be one and only one scan out pin. It is entirely possible to remove this constraint from the ATPG program, and simply bring all of the scan out data streams from the repeated structures to scan out pins of the chip. Assuming that there are no faults, all these scan out data streams are identical, leading to storage of multiple, identical, copies of response data on the tester. In other words, this does not take advantage of the repetitive structures in the logic when observing results.

A second aspect of the present invention provides a means for compressing the test results that can be observed by the tester during a scan operation, and which clearly shows any fault that has been captured. There is preferably one of such mechanisms for each scan input pin that fanned-out. This reduces the volume of response data that must be stored at the tester by eliminating duplicate copies. Various such mechanisms are known in the art. A Multiple Input Signature Register (MISR) with a length equal to or greater than the bit width of the RA being tested, or the repetition factor of the functional block may be used. The MISR can be built using any of the current industry practices. Returning to FIG. 2, the scan outputs of the repeated structures (12) that are fed from a single scan input (7) (e.g., all the scan outputs of an RA) are brought to the parallel inputs of MISR (11), and the last bit of the MISR is connected to scan out pin (8) that is observed by the tester during scan.

This structure results, from the tester point of view, in a single scan chain of length equal to the length of a single one of the repeated, parallel, scan chain segments, plus the length of the MISR, as opposed to a single scan chain of length equal to the total number of bits in the repeated structures. For the single RA illustrated in FIG. 2, this results in a length equal to one (for the data word to be written), plus the number of words in the RA, plus the number of bits in the MISR (equal to or greater than the bit-width of the RA), as opposed to a length equal to the number of bits in a word times (the number of words plus 1). This substantially reduces the length of the scan chain and the test data volume. This also reduces the number of faults for which tests must be generated, which further reduces the volume of resulting test data.

Figure 2:
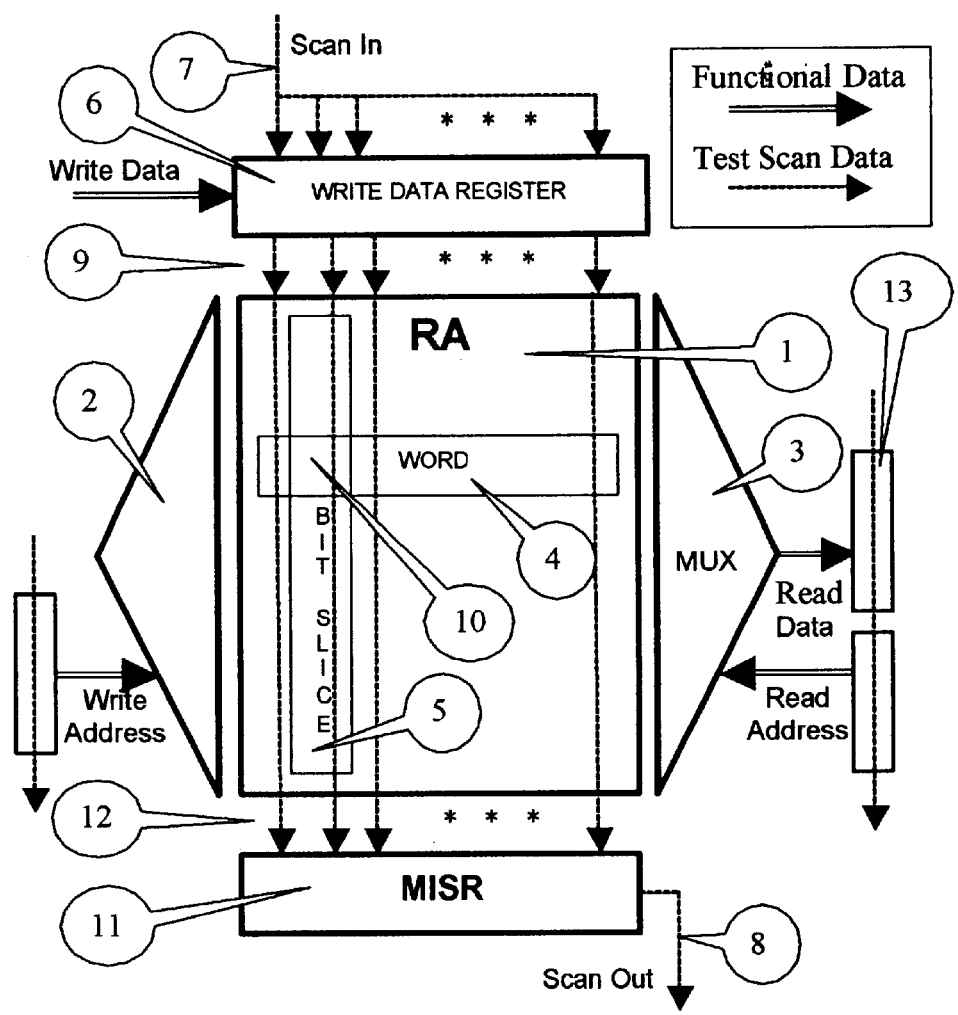
FIG. 2 illustrates the same Register Array having an improved scan structure in accordance with the present invention, wherein scan chain segments within each repeated structure are driven in parallel from a single test stimuli scan data stream, and wherein test responses are compressed and observed as a single response scan data stream during a scanning operation.

To summarize, still using the illustration of FIG. 2, the difference from the prior art resides in the organization and connection of the scan chain segments for test. The preferred architecture requires that there be one scan chain segment per bit-slice (5). The order of the latches in each scan chain segment is the same in terms of which word (4) is associated with a latch in the same ordinal position of the scan chain segments. In addition, the Write Data Register (6) is organized as single scannable latches, rather than being connected to a single scan chain segment. Now, a single scan connection (7) fans-out and is connected to all of the scan inputs of the Write Data Register (6) latches. The scan outputs of the Write Data Register (6) are individually connected (9) to the scan inputs of each bit slice (5) of array (1). (Note: whether the bits of the Write Data Register (6) are connected ahead of or behind the scan segment of bit slice (5) is irrelevant; what matters is that each bit of the Write Data Register (6) be scanned in series with bit slice (5), and that all such constructions be scanned in parallel). Since for most test systems, it is preferred that the numbers of scan inputs and scan outputs be the same, the captured test response data is compressed back into a single scan data stream by MISR (11) of length equal to or greater than the length of Word (4). All the scan segment outputs are connected (12) individually to the parallel inputs of MISR (11). The overflow bit of the MISR is then used as the only scan-out (8) of the structure.

When a fault in latch (10) of Register Array (1), or a fault in the read selection logic (3), or a fault in a latch of the Write Data Register (6) is targeted, all the bits of each word (4), and all the bits of Write Data Register (6) are scanned to the same value across each word. Thus, each copy of the repeated structure will have the same fault or faults tested simultaneously. Note that this occurs even when the test patterns are not generated in a way to target a fault, but are just pseudo-random data such as commonly used to fill generated test patterns, or are generated by a Pseudo-Random Pattern Generator (PRPG) during logic Built-In-Self-Test (BIST).

Extending the Test Structure to Multiple Repeating Structures

In typical prior art ASICs, there may be several hundred RAs and only a few tens of scan chains. Thus, it is necessary to extend the structure for a situation where there is a plurality of RAs in a single scan chain. To simply take the structure of FIG. 2 and concatenate to it several of the same structures presents a problem to the ATPG software in that the input to the second and subsequent arrays is the output of the MISR. It would be all but impossible for the ATPG software to create desired values in the scan chains following the first MISR.

The simplest change requires moving all the MISRs, one for each RA, to the end of the scan chain, and to use the first (or any single) scan chain of each RA to create the single scan path through all of the RAs to one input of the first MISR. Then, only (bit-width −1) scan chains from each RA need to be routed to the parallel inputs of the MISRs. This creates problems when calculating the signatures of the MISRs, since the MISRs now interact with each other.

Figure 3:
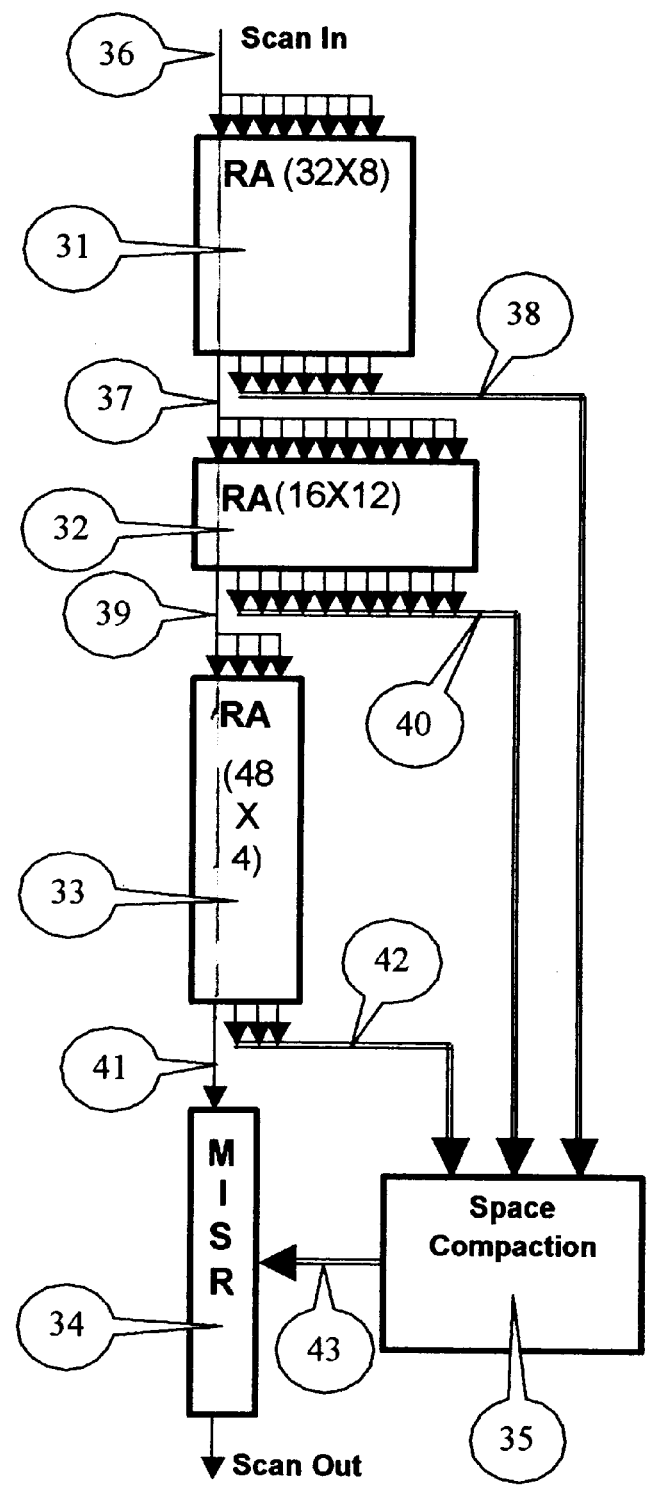
FIG. 3 is a block representation of a detailed embodiment of the present invention illustrating multiple parallel repeated structures, each having the test scan structure shown in FIG. 2, and showing the application of test stimuli and the use of a single compression mechanism.

In a further embodiment of the invention, a single MISR or other test observation mechanism of width equal to or greater than the widest RA in the scan chain is added after the path through the RAs. The rest of the scan chains from the RAs are fed into a conventional space compression circuit. It is essentially an XOR (i.e., exclusive-OR) tree for each MISR input. To preserve the captured response data, scan chain segment outputs from a single RA must be fed to separate inputs of the MISR, but a single scan chain segment output from each of several RAs may be XORed and fed to a single MISR input. This is shown in FIG. 3.

Alternately, the scan chains through the RAs are fed from one RA to the next in parallel, fanning-out a single scan out to multiple scan-in connections when going from a narrower to wider register array, and bypassing narrower register arrays with some register array scan output signals when going from a wider to a narrower RA. The requirement for preserving captured fault data is that no two scan chain segment outputs from any single register array may be combined logically by any means other than the MISR, or other test observation mechanism, which must be as wide or wider than the widest register array. This is shown in FIG. 4a.

Optimally, the RA's that must be concatenated in a scan chain may be ordered from the narrowest to the widest. This is illustrated in FIG. 4b.

What is critical in each of the options for connecting register arrays is that the data scanned into each word of each register array be the same. In other words, every bit of a word of a single register array must take the same ordinal position within the overall scan chain. If, as shown in FIGS. 3 and 4a, the scan outputs of a register array bypass a subsequent narrower array, these outputs must be taken directly to the MISR, or other test observation points, possibly through a space compactor, as shown in FIG. 3, since they are no longer synchronized to the bits being scanned through the later register arrays.

Figure 4A:
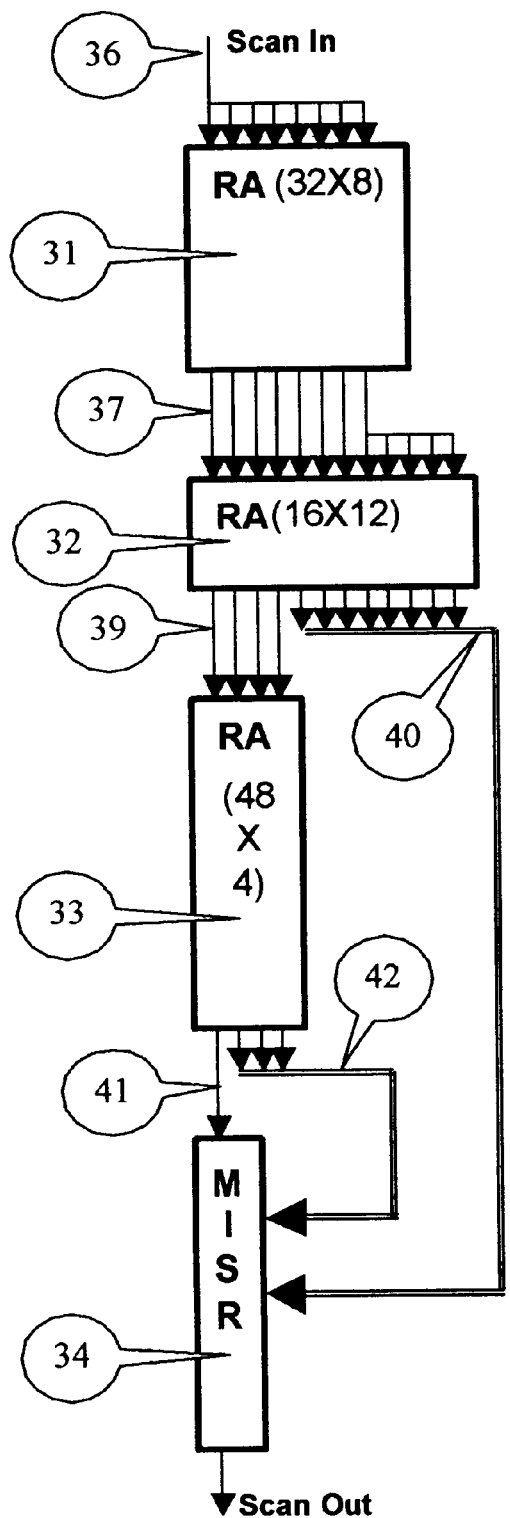
FIGS. 4a–4b are block representation of various other embodiments of the present invention showing the multiple parallel repeated structures illustrated in FIG. 3.
Figure 4B:
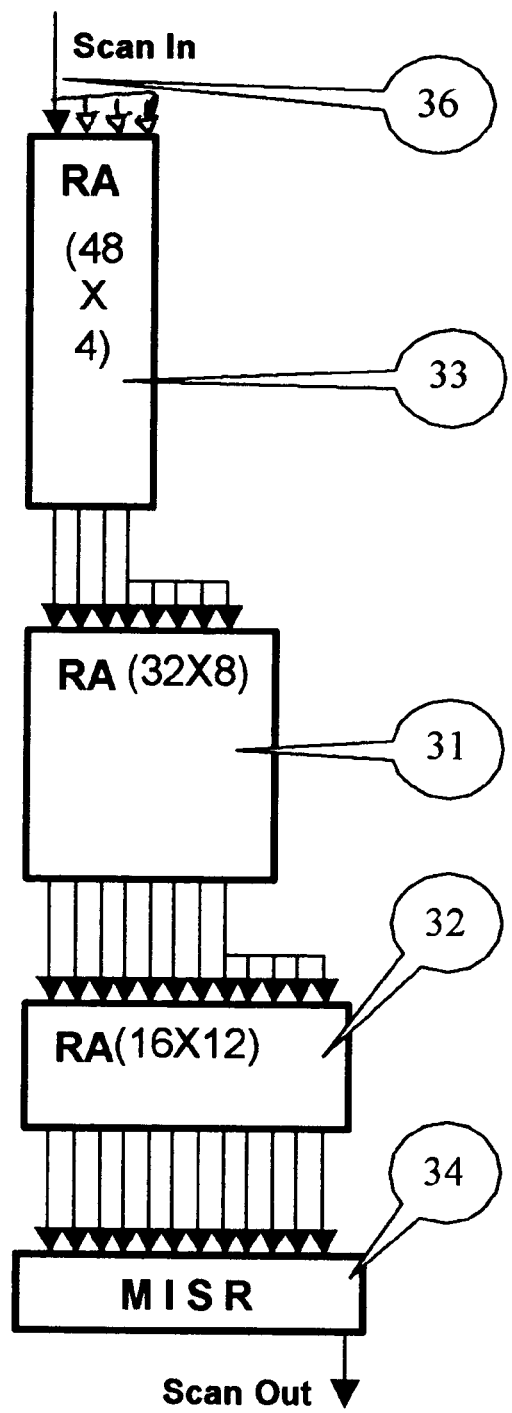

Referring now to FIGS. 3 and 4a–4b in more detail, there are shown two embodiments for adapting the techniques disclosed herein to a situation wherein the number of RAs (or other circuits built of repeated structures) exceeds the number of scan chains. Both figures show the same three blocks (31, 32, 33), each with a different number of repeated structures (bit slices) and, therefore, scan chain segments. For simplicity sake, the Write Data Register and Read Addressing logic shown in previous figures are integral to the RA block and the write addressing logic. The remaining registers which are not part of the repeated structures are omitted. A single MISR (34) is provided to compress the results for all of the blocks connected serially in this single scan chain. The scan chain originates at scan-in (36) and is distributed to all of the scan-in connections of the first RA block (31).

In FIG. 3, a single scan output of each RA in turn is routed to the next RA or to the MISR. Other scan outputs from each RA are space compacted before being connected to the MISR. Thus, output (37) of the first RA (31) is routed and distributed to all of the scan input connections of the second RA (32). Scan output (39) of the second RA (32) is routed and distributed to all of scan input connections of the third RA (33). Finally, scan output (41) from the third RA (33) is routed to the first parallel input of the MISR (34). All other scan outputs from the three RAs (38, 40, 42) are bussed and routed to a space compression circuit (35).

In the present embodiment, Space Compactor (35) consists of bit-wise Exclusive-or (XOR) trees. That is, if it is assumed that the scan output that is routed directly (37, 39, 41) resides in ordinal position 1 of the scan outputs of each RA, then Space Compactor (35) Exclusive-ORs the scan outputs in ordinal position 2 of all the RAs and makes the result available to MISR (34) parallel input ordinal position 2. From there, it is then applied to each ordinal position up to the width of the widest RA. In the present example, there are shown three 3-input XOR circuits, one for each of the ordinal positions 2 through 4, four 2-input XOR circuits for ordinal positions 5 through 8. Ordinal positions 9 through 12 are directly connected to the MISR inputs since there is only one RA that is more than 8 bits wide.

In FIG. 4a, the scan outputs of each RA are wired in parallel to the scan inputs of the next RA or MISR in sequence in the scan chain. In the example shown, the first RA (31) is narrower than the second RA (32); thus, one of the parallel scan signals (37) will be distributed to the additional scan input pins of the second RA (32). The second RA (32) is wider than the third RA (33). Accordingly, only the numbers of scan outputs that match the number of scan inputs are wired directly (39) from the second to the third RA (33). The rest of the scan outputs of the second RA (32) are bused (40) around the third RA (33). Finally, outputs (41, 42) of the last RA (33) are connected to inputs of MISR (34) along with any outputs from previous blocks (40).

As it is often desirable to keep the parallel scan chain segments to the same length, it is preferred that the RAs within a single scan chain be ordered from the narrowest to widest, (33, 31, 32), as shown in FIG. 4b, although this is not always practical. In the present arrangement, there are the same number of scan stages between Scan in (36) and all the inputs to MISR (34).

Extending the Test Structure to Complex Functional Blocks

Finally, while the present description of the invention has been in terms of bit slices such as those inherent in register arrays, which present a significant test volume problem to ASICs and which are simple to understand, the invention applies to any form of repetitive logic. By way of example, several processor macros or other large macros with several non-identical scan chain segments within the macro may be instantiated on a single chip. The same test data, in the form of multiple scan data streams, may be fanned-out from a single test pattern source, such as a manufacturing tester, to all of the macro scan segment inputs in parallel. That is, the same test data stream is coupled to the same scan-in of each macro, but with different streams delivered to different scan-in pins. The test results are compressed into multiple MISRs, one for each scan data stream, as will be described hereinafter with reference to FIG. 5. This technique substantially reduces the test data volume in such complex chips without loss of test coverage.

Figure 5:
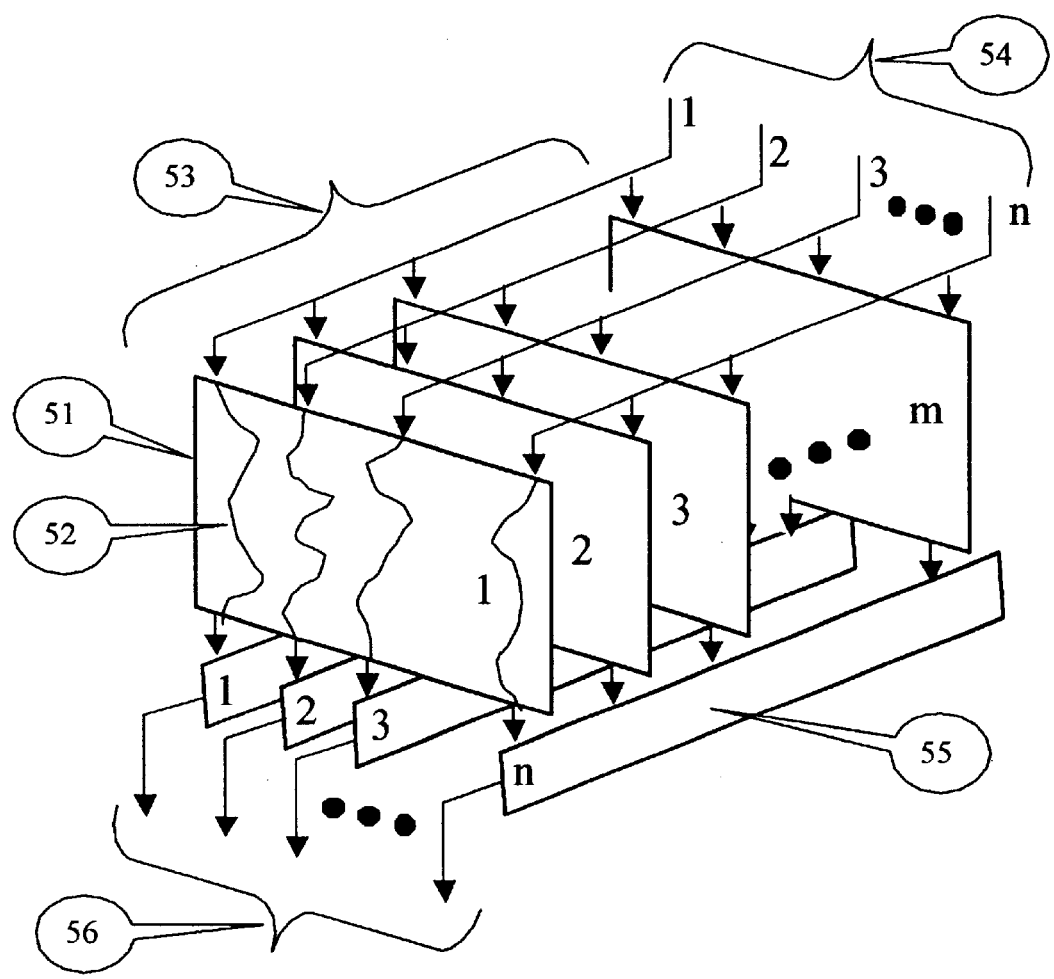
FIG. 5 illustrates a three dimensional view of multiple copies of a complex macro connected for parallel testing, in accordance with the present invention.

FIG. 5 shows an extension of the present invention to a more complex set of multiple instantiated large macros, each having multiple, non-identical, scan chain segments. If the macros are sufficiently small, the multiple scan chain segments of a single macro may be serially connected to create a single scan chain segment. This situation is identical to one already illustrated using the bit slice structure of an RA.

However, for reasons associated with the number, length, and balancing of the scan chains in a chip, it may be impractical to perform such serialization.

Still referring to FIG. 5, a macro (51) is shown consisting of multiple scan chain segments (52) numbered for convenience sake from 1 to n. As symbolized by the different paths of the dashed lines, these scan chain segments within a single macro are structurally different from each other, so the ideas contained herein cannot be applied to the macro by itself. If multiple copies (53) of the macro, numbered for convenience sake from 1 to m, are instantiated on a single chip, then each scan chain segment within the macro is also repeated m times. In the traditional test methods, no advantage is taken of this regularity. The m by n scan chain segments are connected serially in any order into the desired number of chip scan chains.

Using the method described heretofore, a single scan data stream is connected to every instance of the first scan chain segment in the multiply instantiated macros; a second scan data stream connected to every instance of the second scan chain segment, and so on. This requires n scan data streams (54). For each scan data stream (54), a response compression circuit (55) will typically be provided. In the present embodiment, this circuit is preferably a MISR, although if the number m is small (e.g., below 8) a simple space compression using an XOR tree and the like may be preferred. The compression circuit (55) creates a single scan out data stream (56), preferably matching the number of input data streams (54).

As previously described, this arrangement appears to the test pattern generator as if there is only one instantiated macro, and any fault targeted in that macro will be simultaneously tested in all the copies of the macro. This significantly reduces the volume of test data with no loss in test coverage.

Diagnostic Scan

In order to support diagnosing failures within the RAs or other repeated functional blocks, there should be a mechanism, under control of the tester, which causes all of the scan chains of an RA to be connected such that no scan chains fan-out to multiple chain segments in parallel, i.e., to connect the RA scan chains serially instead of in parallel. Simultaneously, the feedback mechanisms of the MISRs, if any, are turned off. A failing test pattern may then be applied to the ASIC, with the ASIC being switched by the tester to diagnostic mode, and all of the responses are scanned out for analysis. This mode creates again very long scan chains, but this only occurs when diagnosing failures. This has at best a minor impact on the overall test application time. This mode also provides a test backup in case correlated data prevents testing certain faults, as described above.

Other Test Modes

While the discussion to this point describes the ASIC as a circuit under test on a manufacturing tester station, the technique applies without significant change to any scan testing method. The appropriate source of scan data and the appropriate scan observer may be substituted for the tester described in the above discussion.

By way of example, Logic Built-In Self Test (LBIST) frequently uses a Pseudo-Random Pattern Generator (PRPG), and possibly a spread network, to generate the scan data, and uses another MISR as the response observer. The scan path structures disclosed by this invention work equally well in the scan channels of that environment. In fact, this technique may be particularly helpful to LBIST and other similar test techniques that use pseudo-random data for testing RAs because it takes advantage of the regularity of the RA to sensitize many more faults with each pattern that is effective for testing the RA It is to be understood that, while the detailed drawings and specific examples given describe preferred embodiments of the invention, they are for illustrative purposes only, that the structure and method of the invention are not limited to the precise details and conditions disclosed, and that various changes and modifications may be made without departing from the spirit of the invention which is defined by the following claims.

I claim:

1. A method of testing an integrated circuit, chip, or module comprising:

a plurality of structures, each of said structures comprising a plurality of identical bit slices, each of said bit slices including one scan chain segment;

a scan chain linking all of said bit slice scan chain segments of said plurality of structures, wherein for a first structure of said plurality of said structures, a scan chain source fans-out and is coupled to all the inputs of said bit scan chain segments of said first structure;

for each subsequent structure, an output of said bit slice scan chain segments from the preceding structure fans-out and is coupled to inputs of all of said bit slice scan chain segments of said subsequent structure, and all remaining outputs of said bit slice scan chain segments of said preceding structure are coupled to test observation points; and all of the outputs of said bit slice scan chain segments of the last of said structures are connected to said test observation points;

the method of testing comprising the steps of:

1) scanning-in a predetermined test pattern into said scan chain source, said predetermined test pattern being replicated for each of the bit slices of each structure of said plurality of structures, resulting in the same predetermined test pattern being applied to all of said bit slice scan chain segments of each structure of said plurality of structures;

2) propagating said predetermined test pattern through all the structures concurrently, and capturing the results of said propagation in the scan chain segments; and 3) scanning-out the captured results from the scan chain segments to said test observation points and comparing said results to a known good test pattern.

2. The method as recited in claim 1, wherein said test observation points are selected from the group consisting of scan output pins, scan inputs of independent scan chains, inputs to a multiple input signature register (MISR) and inputs to a compression circuit.

3. The method as recited in claim 1, wherein said bit slice is a bounded collection of logic elements comprising at least one sequential logic element, said logic elements in each of said bounded collections being identical in type and number, and being connected in the same manner, and wherein all of said sequential elements are coupled to at least one scan chain segment in order to scan test patterns into the bit slice, said scan chain segments being ordered and connected identically to each other.

4. The method as recited in claim 1, wherein each of said scan chain segments is respectively coupled to one of said bit slices of said structure.

5. The method as recited in claim 4 wherein said scan chain segments of each of said bit slices receives the same stimuli.

6. The method as recited in claim 1, wherein corresponding scan inputs of identical scan chain segments of said bit slices are coupled to one input scan chain source.

7. The method as recited in claim 1, wherein an output of said scan chain segments of one of said structures is coupled to at least one of the inputs of said scan chain segments of another one of said structures.

8. The method as recited in claim 1, wherein the outputs of said bit slice scan chain segments in any of said structures are connected to said test observation points.

9. The method as recited in claim 1 further comprising means for controlling the state of said bit slice scan chain segments that requires less test data than conventional scan structures per predetermined test pattern.

10. The method as recited in claim 9, wherein said means for controlling the state of said bit slice scan chain segments tests corresponding faults in each copy of said bit slice with a single test pattern, thereby reducing the number of test patterns by a factor approximately equal to the count of said bit slices.

11. A method of testing an integrated circuit, chip, or module comprising:
a plurality of structures, each of said structures comprising a plurality of identical bit slices, each of the bit slices including one scan chain segment;
a scan chain linking all of said bit slice scan chain segments of said plurality of structures, wherein
for a first structure of said plurality of said structures, a scan chain source fans-out and is coupled to all the inputs of said bit scan chain segments of said first structure; and wherein
when the number of bit slices in a subsequent structure is equal to the number of bit slices in a previous structure, then all of the outputs of said bit slice scan chain segments of said previous structure are respectively coupled to inputs of said bit slice scan chain segments of said subsequent structure;
when the number of bit slices in a subsequent structure exceeds the number of bit slices in a previous structure, then all the outputs of said bit slice scan chain segments of the previous structure are coupled to the inputs of said bit slice scan chain segments of the subsequent structure, and at least one output of said bit slice scan chain segment of the preceding structure fans-out and is coupled to excess inputs of said bit slice scan chain segments of said subsequent structure;
when the number of bit slices in a subsequent structure is less than the number of bit slices in a previous structure, then the outputs of said bit slice scan chain segments of said previous structure are coupled to the inputs of said bit slice scan chain segments of said subsequent structure up to the number of bit slices in said subsequent structure, and the remaining outputs of said bit slice scan chain segments from said previous structure are connected to test observation points; and
all of the outputs of said bit slice scan chain segments of the last structure are connected to said test observation points;
the method of testing comprising the steps of:
1) scanning-in a predetermined test pattern into said scan chain source, said predetermined test pattern being replicated for each of the bit slices of each structure of said plurality of structures, resulting in the same predetermined test pattern being applied to all of said bit slice scan chain segments of each structure of said plurality of structures;
2) propagating said predetermined test pattern through all the structures concurrently, and capturing the results of said propagation in the scan chain segments; and
3) scanning-out the captured results from the scan chain segments to said test observation points and comparing said results to a known good test pattern.

12. A method of testing an integrated circuit, chip, or module comprising:
a plurality of structures, each of said structures comprising a plurality of identical bit slices, each of said bit slices including a plurality of ordered scan chain segments, all of the ordered scan chain segments having the same ordinal being identical;
for each structure of said plurality of structures, an ordered set of scan chain sources, equal in number to the number of scan chain segments in a bit slice, fanning-out and being coupled to all the inputs of said bit slice scan chain segments, wherein the first one of said scan chain sources is coupled to the first scan chain segment of each of said bit slices, and a subsequent scan chain source is coupled to a subsequent scan chain segment of each of said bit slices; and
all of the outputs of said bit slice scan chain segments of each structure of said plurality of structures are connected to test observation points;
the method of testing comprising the steps of:
1) scanning-in a predetermined test pattern into said ordered scan chain sources, said predetermined test pattern being replicated for each of the bit slices of each structure of said plurality of structures, resulting in the same predetermined test pattern being applied to all of said bit slice scan chain segments having the same ordinal for each structure of said plurality of structures;
2) propagating said predetermined test pattern through all the structures concurrently, and capturing the results of said propagation in the scan chain segments; and
3) scanning-out the captured results from the scan chain segments to said test observation points and comparing said results to a known good test pattern.

13. A method of testing an integrated circuit, chip, or module comprising:
at least one structure, said at least one structure comprising a plurality of identical bit slices, each of said bit slices including one scan chain segment;
for said at least one structure, a scan chain source fanning-out and being coupled to all the inputs of said bit slice scan chain segments, and all the outputs of said bit slice scan chain segments being connected to test observation points;
the method of testing comprising the steps of:
1) scanning-in a predetermined test pattern into said scan chain source, said predetermined test pattern being replicated for each of said bit slices of said at least one structure, resulting in the same predetermined test pattern being applied to all of said bit slice scan chain segments of said at least one structure;
2) propagating said predetermined test pattern through said at least one structure, and capturing the results of said propagation in said scan chain segments; and
3) scanning-out the captured results from said scan chain segments to said test observation points and comparing said results to a known good test pattern.

14. A program storage device readable by a machine, tangibly embodying a program of instructions executable by the machine to perform method steps for testing an integrated circuit, chip, or module comprising,
a plurality of structures, each of said structures comprising a plurality of identical bit slices, each of said bit slices including one scan chain segment;

a scan chain linking all of said bit slice scan chain segments of said plurality of structures, wherein
    for a first structure of said plurality of said structures, a scan chain source fans-out and is coupled to all the inputs of said bit scan chain segments of said first structure;
    for each subsequent structure, an output of said bit slice scan chain segments from the preceding structure fans-out and is coupled to inputs of all of said bit slice scan chain segments of said subsequent structure, and all remaining outputs of said bit slice scan chain segments of said preceding structure are coupled to test observation points; and
    all of the outputs of said bit slice scan chain segments of the last of said structures are connected to said test observation points;

said method steps comprising:
1) scanning-in a predetermined test pattern into said scan chain source, said predetermined test pattern being replicated for each of the bit slices of each structure of said plurality of structures, resulting in the same predetermined test pattern being applied to all of said bit slice scan chain segments of each structure of said plurality of structures;
2) propagating said predetermined test pattern through all the structures concurrently, and capturing the results of said propagation in the scan chain segments; and
3) scanning-out the captured results from the scan chain segments to said test observation points and comparing said results to a known good test pattern.

\* \* \* \* \*